United States Patent
Kusano (10) Patent No.: US 9,754,876 B2
(45) Date of Patent: Sep. 5, 2017

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Kenichirou Kusano, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/296,330

(22) Filed: Oct. 18, 2016

(65) Prior Publication Data

US 2017/0117221 A1    Apr. 27, 2017

(30) Foreign Application Priority Data

Oct. 22, 2015   (JP) ................. 2015-208372

(51) Int. Cl.
| | |
|---|---|
| H01L 23/62 | (2006.01) |
| H01L 23/525 | (2006.01) |
| H01L 23/528 | (2006.01) |
| H01L 23/31 | (2006.01) |

(52) U.S. Cl.
CPC ...... *H01L 23/5256* (2013.01); *H01L 23/3171* (2013.01); *H01L 23/528* (2013.01)

(58) Field of Classification Search
CPC ............ H01L 23/3171; H01L 23/5256; H01L 23/5258; H01L 23/62; H01L 27/11206
See application file for complete search history.

(56) References Cited

U.S. PATENT DOCUMENTS 5,914,524 A * 6/1999 Komenaka .......... H01L 23/5256
                                                                257/209

FOREIGN PATENT DOCUMENTS

| | | |
|---|---|---|
| JP | H06-104335 A | 4/1994 |
| JP | H06-104338 A | 4/1994 |
| JP | 2011-232161 A | 11/2011 |

* cited by examiner

*Primary Examiner* — Daniel Shook
(74) *Attorney, Agent, or Firm* — Volentine & Whitt, PLLC (57) ABSTRACT

A semiconductor device including: a fuse element; and a fuse window that is formed above a region including the fuse element, that includes a pair of first sidewalls extending in a first direction running along a direction that current flows in the fuse element and a pair of second sidewalls extending in a second direction intersecting the first direction, and that is formed with a projection projecting out from a sidewall side toward the inside at an inner wall of at least one out of the first sidewalls or the second sidewalls, the projection having a sidewall side width that is narrower than a projecting side width.

12 Claims, 8 Drawing Sheets

SEMICONDUCTOR DEVICE AND SEMICONDUCTOR DEVICE MANUFACTURING METHOD

CROSS-REFERENCE TO RELATED APPLICATION

This application is based on and claims priority under 35 USC 119 from Japanese Patent Application No. 2015-208372 filed on Oct. 22, 2015 the disclosure of which is incorporated by reference herein.

BACKGROUND

Technical Field

The present disclosure relates to a semiconductor device and a semiconductor device manufacturing method.

Related Art

Semiconductor devices provided with a fuse element are commonly known. In these semiconductor devices, a protective film covers a region that includes a fuse element. It is difficult to penetrate the protective film and blow the fuse element from above the protective film. Accordingly, fuse windows are formed above the fuse element in these semiconductor devices.

Figure 13A:
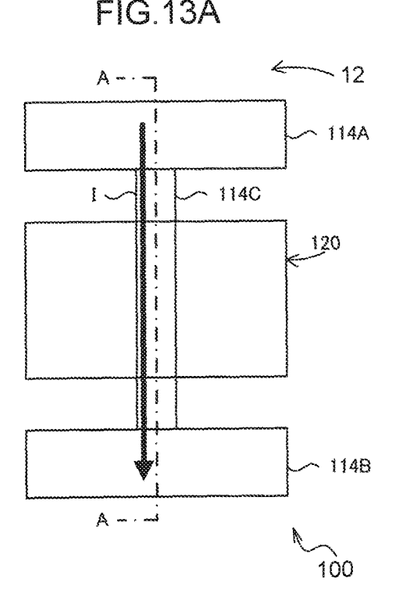
FIG. 13A is a plan view of an example of a conventional semiconductor device.
Figure 13B:
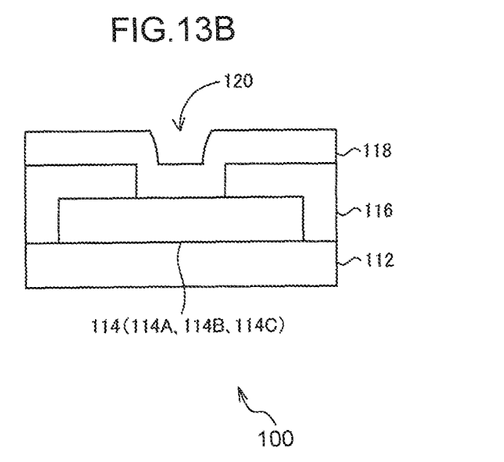
FIG. 13B is a cross-section along line A-A in FIG. 13A.

In the example of a conventional semiconductor device 100 illustrated in FIGS. 13A and 13B, a rectangular shaped fuse window 120 is formed above a fuse element 114C. A silicon oxide film 116 and a silicon nitride film 118, serving as protective films, are stacked above a metal layer 114.

In the state illustrated in FIGS. 13A and 13B, current I flows from a metal layer 114A to a metal layer 114B due to the fuse element 114C not being blown.

When the fuse element 114C is to be blown, a laser or the like may be employed to blow the fuse element 114C inside the fuse window 120.

Japanese Patent Application Laid-Open (JP-A) No. H06-104338 describes technology in which a projection portion (a protrusion) that projects outward is provided inside a fuse window, and the projection portion is employed to position a laser beam that blows a fuse element.

Figure 14A:
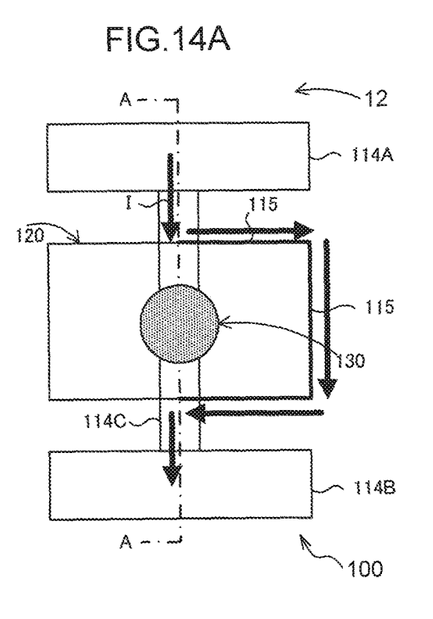
FIG. 14A is a plan view for explaining a current path (leak path) in the conventional semiconductor device illustrated in FIGS. 13A and 13B.
Figure 14B:
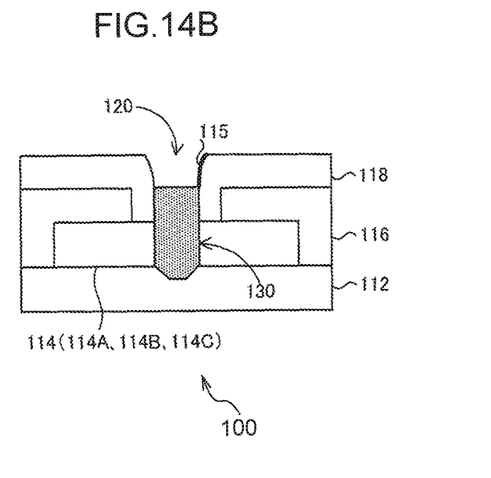
FIG. 14B is a cross-section along line A-A in FIG. 14A.

In the conventional semiconductor device 100 illustrated in FIGS. 13A and 13B, sublimate generated when the fuse element 114C is blown adheres as deposit 115 to the inside of sidewalls of the fuse window 120, as illustrated in FIGS. 14A and 14B. In the conventional semiconductor device 100 illustrated in FIGS. 14A and 14B, a current path (what is known as a leak path) through which current I flows is formed by the deposit 115 due to the deposit 115 adhering to the entirety of the inside of the sidewalls of the fuse window 120.

There is accordingly an issue in that sometimes, even though the fuse element 114C has been blown, electrical continuity is produced between the metal layer 114A and the metal layer 114B, and shorting occurs.

Even if, for example, the technology described in JP-A H06-104338 were applied to address the above issue, the projection portion in the technology described in JP-A H06-104338 is provided for a different purpose. The shape of the projection portion would have to be made larger in order to be employed for positioning a laser beam, and accordingly the shape of the fuse window would also be made larger. Moreover, the technology of H06-104338 only describes using a projection as a positioner for a laser beam, and is insufficient to resolve the above issue.

SUMMARY

In consideration of the above circumstances, the present disclosure provides a semiconductor device and a semiconductor device manufacturing method capable of suppressing shorting from occurring even though a fuse element has been blown.

In order to achieve the above object, a semiconductor device of the present disclosure includes a fuse element and a fuse window. The fuse window is formed above a region including the fuse element, includes a pair of first sidewalls extending in a first direction running along a direction that current flows in the fuse element and a pair of second sidewalls extending in a second direction intersecting the first direction, and is formed with a projection projecting out from a sidewall side toward the inside at an inner wall of at least one out of the first sidewalls or the second sidewalls. The projection has a sidewall side width that is narrower than a projecting side width.

A semiconductor device of the present disclosure includes a fuse element and a fuse window. The fuse window is formed above a region including the fuse element, includes a pair of first sidewalls extending in a first direction running along a direction that current flows in the fuse element and a pair of second sidewalls extending in a second direction intersecting the first direction, and is formed with a projection projecting out from a sidewall side toward the inside at an inner wall of at least one out of the first sidewalls or the second sidewalls. The projection has a sidewall side width that is shorter than a sidewall length from a sidewall end portion to the projection and that is the same as an inner side width of the projection.

A semiconductor device manufacturing method of the present disclosure includes a process of forming a first protective film onto a region covering a region including a fuse element, a process of removing the first protective film on a region including the fuse element and forming a fuse window, and a process of forming a second protective film onto a region covering the first protective film and the inside of the fuse window. The fuse window is formed above the region including the fuse element. The fuse window includes a pair of first sidewalls extending in a first direction running along a direction that current flows in the fuse element and a pair of second sidewalls extending in a second direction intersecting the first direction, and is formed with a projection projecting out from a sidewall side toward the inside at an inner wall of at least one out of the first sidewalls or the second sidewalls. The projection has a sidewall side width that is narrower than a projecting side width The present disclosure achieves the advantageous effect of being able to suppress the occurrence of shorting even though a fuse element has been blown.

BRIEF DESCRIPTION OF THE DRAWINGS

Exemplary embodiments of the present disclosure will be described in detail based on the following figures, wherein.

DETAILED DESCRIPTION

Explanation follows regarding exemplary embodiments of the present disclosure, with reference to the drawings. Note that in the drawings, portions having similar functions are appended with the same reference numerals, and duplicate explanation is omitted as appropriate.

First Exemplary Embodiment

Figure 1A:
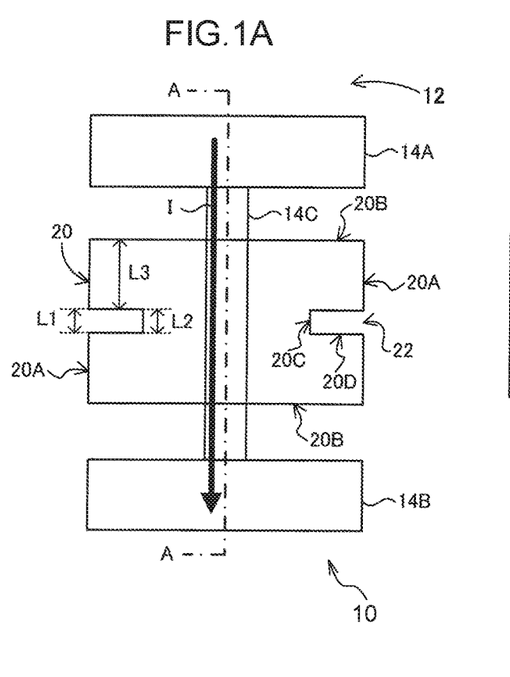
FIG. 1A is a plan view of an example of a semiconductor device of a first exemplary embodiment.
Figure 1B:
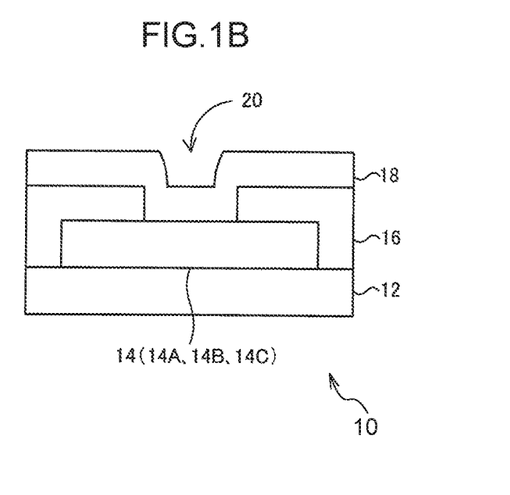
FIG. 1B is a cross-section along line A-A in FIG. 1A.

FIGS. 1A and 1B illustrate a plan view of a semiconductor device 10 of the present exemplary embodiment and a cross-section taken along line A-A of the plan view. As illustrated in FIGS. 1A and 1B, the semiconductor device 10 of the present exemplary embodiment includes a metal layer 14 formed above an insulating layer 12.

The metal layer 14 includes a metal layer 14A, a metal layer 14B, and a fuse element 14C. Specific examples of the material of the metal layer 14 include aluminum (Al) based metals such as AlCu and AlSiCu.

As illustrated in FIG. 1A, current I flows in the direction of from the metal layer 14A toward the metal layer 14B (or in the direction opposite thereto) in a state in which the fuse element 14C has not been blown.

As illustrated by the cross-section along line A-A in FIG. 1B, a silicon oxide layer 16 and a silicon nitride film 18 are stacked above the metal layer 14. Note that depiction of the silicon oxide film 16 and the silicon nitride film 18 is omitted from the plan view of FIG. 1A. The silicon oxide film 16 and the silicon nitride film 18 are what is known as passivation films, and function as protective films. A high-density plasma (HDP) $SiO_2$ film is a specific example of the silicon oxide film 16. A plasma $SiN_4$ film is a specific example of the silicon nitride film 18. Note that the silicon oxide film 16 is an example of a first protective film of the present disclosure, and the silicon nitride film 18 is an example of a second protective film of the present disclosure.

A fuse window 20 where the silicon oxide film 16 has been removed is formed above the fuse element 14C. Accordingly, as illustrated by the cross-section along line A-A in FIG. 1B, only the silicon nitride film 18 is formed above the fuse element 14C and the insulating layer 12 inside the fuse window 20.

Figure 2:
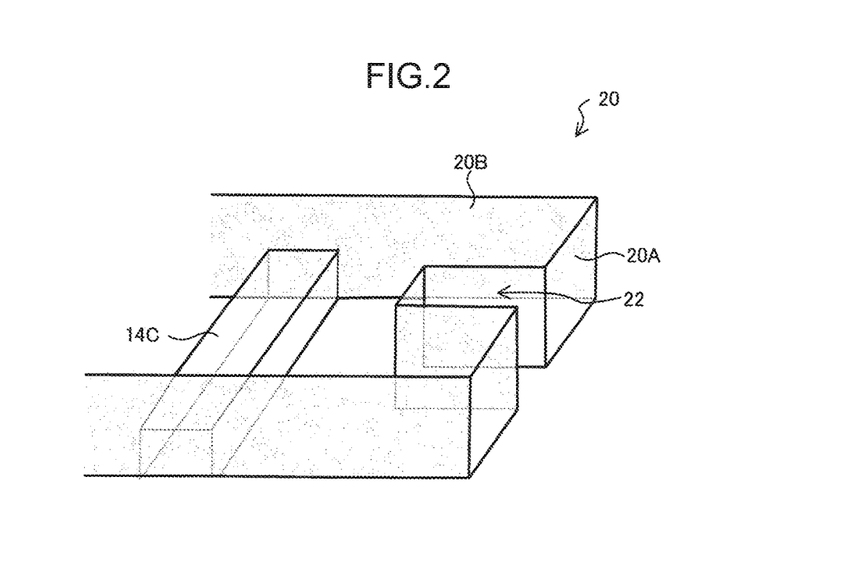
FIG. 2 is a perspective view illustrating a portion of a fuse window of a semiconductor device of the first exemplary embodiment.

As illustrated by FIGS. 1A, 1B, and FIG. 2, the fuse window 20 of the present exemplary embodiment includes a pair of sidewalls 20A extending in a first direction running along the direction that current I flows in the fuse element 14C, and a pair of sidewalls 20B extending in a second direction intersecting the first direction. The sidewalls 20A are an example of first sidewalls of the present disclosure, and the sidewalls 20B an example of second sidewalls of the present disclosure.

As illustrated in FIG. 1A, the lengths of the sidewalls 20A are shorter than the lengths of the sidewalls 20B in the present exemplary embodiment. A projection 22 is formed to each of the pair of sidewalls 20A. As illustrated in FIG. 1A and the perspective view of FIG. 2, the projections 22 project out at inner walls of the sidewalls 20A from the sidewall side toward the inside where the fuse element 14C is formed.

In the present exemplary embodiment, a width L1 of the sidewall side of the projections 22 and a width L2 of the projecting side of the projections 22 are the same. Note that "the same" may refer to configurations that are not exactly the same, and even cases in which there is a difference may be considered to be the same as long as the difference is within a predetermined margin of error.

A length L3 from end portions of the sidewalls 20A to the projections 22 is longer than the sidewall side width L1 of the projections 22. Specifically, the length L3 from the end portions of the sidewalls 20A to the projections 22 is preferably at least two times greater than the sidewall side width L1. The sidewall side width L1 may be determined in accordance with the method of manufacture, a size of a laser repair section 30 (see FIG. 3), and an area or the like of the fuse window 20. In the present exemplary embodiment, the sidewall side width L1 is set to 0.5 μm as a specific example.

As explained in detail later, a length of sides 20D of the projections 22 reaching from the sidewalls 20A to inner sides 20C of the projections 22 is preferably long, as this makes it hard for sublimate from the metal layer 14 to adhere. The length of the sides 20D may be determined in accordance with the size allowed by the fuse window 20, the size of the laser repair section 30 (see FIGS. 3A and 3B), the sublimate, and the like. It is preferable to determine the distance from the laser repair section 30 to the sides 20C taking into account pattern collapse due to heat during laser repair. In the present exemplary embodiment, this distance is set to 2.0 μm or greater as a specific example.

Figure 3A:
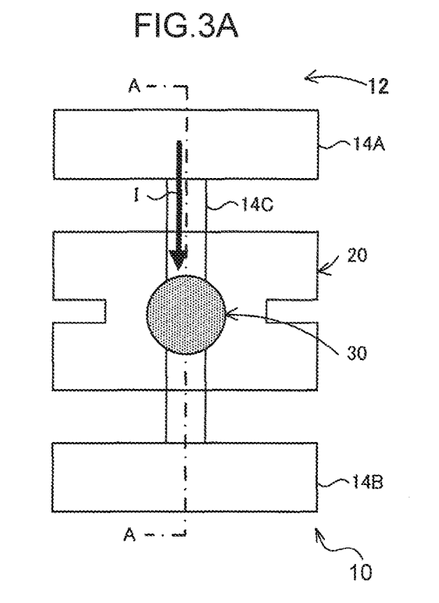
FIG. 3A is a plan view for explaining fuse element blowing in the semiconductor device illustrated in FIG. 1.
Figure 3B:
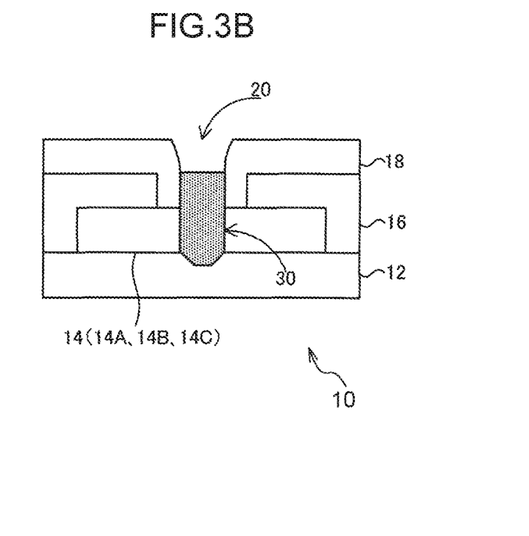
FIG. 3B is a cross-section along line A-A in FIG. 3A.

When the fuse element 14C is to be blown, the fuse element 14C inside the fuse window 20 is blown as illustrated in FIG. 3A. For example, the fuse element 14C is melted by a laser, or blown by what is known as laser repair. As illustrated in FIGS. 3A and 3B, current I is interrupted at the laser repair section 30 and is unable to flow from the metal layer 14A to the metal layer 14B.

When laser repair is performed on the fuse element 14C, sublimed metal may adhere as deposit to the inner walls of the fuse window 20. This sublimate has the feature of extending radially from the blown area (the laser repair section 30).

Figure 4:
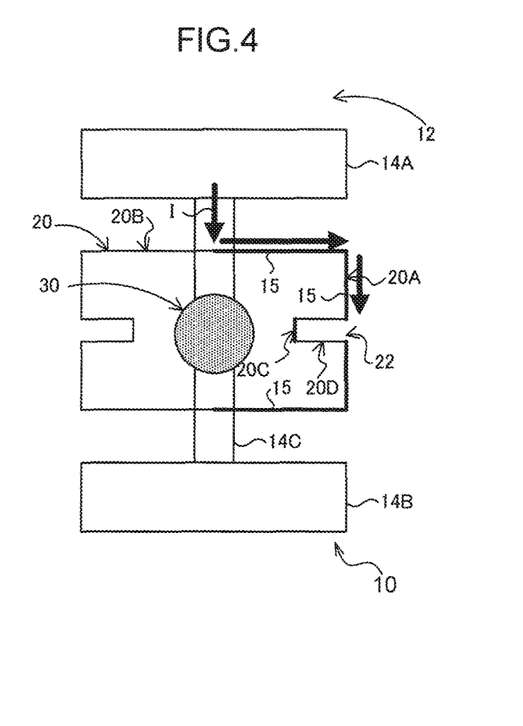
FIG. 4 is a plan view for explaining a current path interruption effect in the semiconductor device illustrated in FIG. 1.

As illustrated in FIG. 4, in the semiconductor device 10 of the present exemplary embodiment, deposit 15 adheres to the inside of the sidewalls 20B of the fuse window 20. Deposit 15 also adheres to inside of portions reaching from the end portions of the sidewalls 20A to the projections, and also adheres to the fuse element 14C side of the inner sides 20C of the projections 22. Deposit 15 does not adhere to the sides 20D of the projections 22 that reach from the sidewalls 20A to the sides 20C due to the sides 20D being shielded by the sides 20C.

Thus, as illustrated in FIG. 4, the path through which current I flows is interrupted at the sides 20D. Accordingly, current I does not reach the metal layer 14B and there is no electrical continuity.

Consequently, according to the semiconductor device 10 of the present exemplary embodiment, the occurrence of shorting even though the fuse element 14C has been blown can be suppressed.

As described above, a length L3 from the end portions of the sidewalls 20A to the projections 22 is longer than the sidewall side width L1. In cases in which the length L3 is shorter than the sidewall side width L1, defects may arise during formation of the fuse window 20, the projecting side width L2 may not be the same as the sidewall side width L1, and the projecting side width L2 may become narrower than the sidewall side width L1. In such cases, the effectiveness of the interruption of the path through which current I flows is reduced due to there being an increased possibility that sublimate will adhere to the sides 20D when the fuse element 14C is blown, as described above. In order to increase this effectiveness, the length L3 from the end portions of the sidewalls 20A to the projections 22 is preferably at least two times greater than the sidewall side width L1, and is more preferably at least four times greater than the sidewall side width L1.

The semiconductor device 10 of the present exemplary embodiment may, for example, be manufactured according to the following process.

Figure 5A:
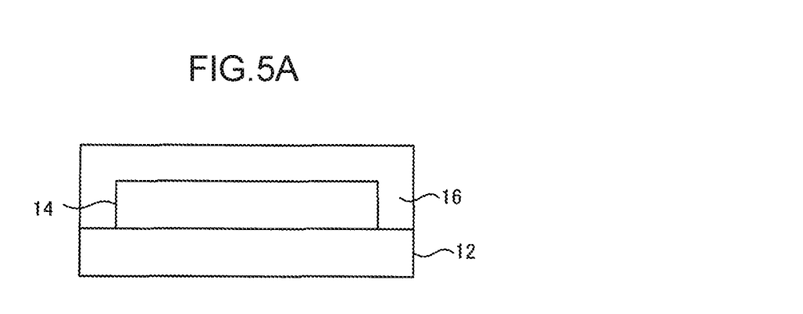
FIGS. 5A to 5C are diagrams explaining a semiconductor device manufacturing method of the first exemplary embodiment.

Firstly, as illustrated in FIG. 5A, in a first process the silicon oxide film 16 is formed as a film using a HDP method on a region above the insulating layer 12 that covers a region including the metal layer 14.

Figure 5B:
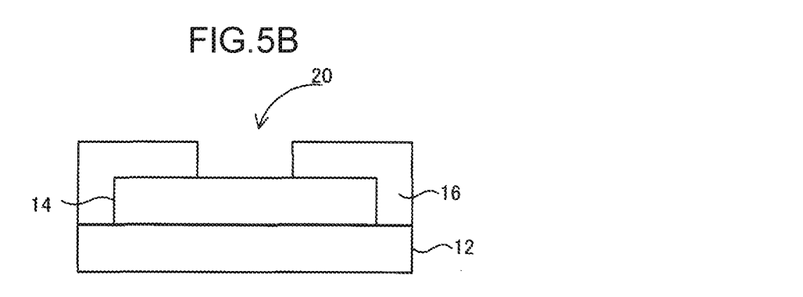

Next, in a second process of FIG. 5B, the silicon oxide film 16 in a region above the fuse element 14C is removed to form the fuse window 20. Using a photolithographic pattern, a mask is formed that exposes only the fuse window 20 portion formed with the above-described projections 22, and the mask is used to perform etching to remove the silicon oxide film 16 of the fuse window 20 portion.

Figure 5C:
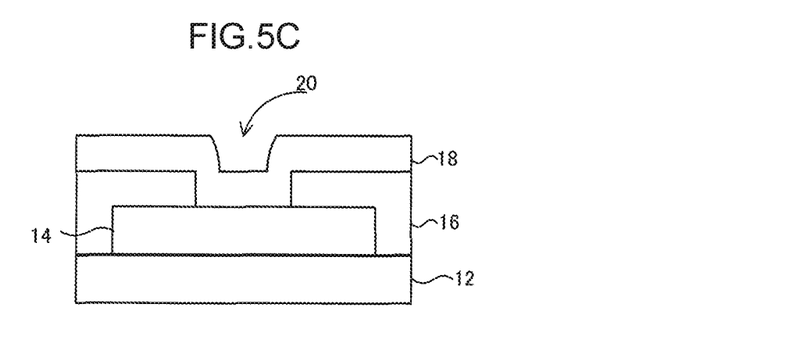

Next, in a third process of FIG. 5C, the silicon nitride film 18 is formed as a film by a plasma chemical vapor deposition (CVD) method so as to cover the silicon oxide film 16 and the inside of the fuse window 20.

Thus, in the present exemplary embodiment, the semiconductor device 10 including the fuse window 20 formed with the projections 22 is manufactured according to the first to third processes illustrated in FIGS. 5A to 5C.

Second Exemplary Embodiment

Figure 6:
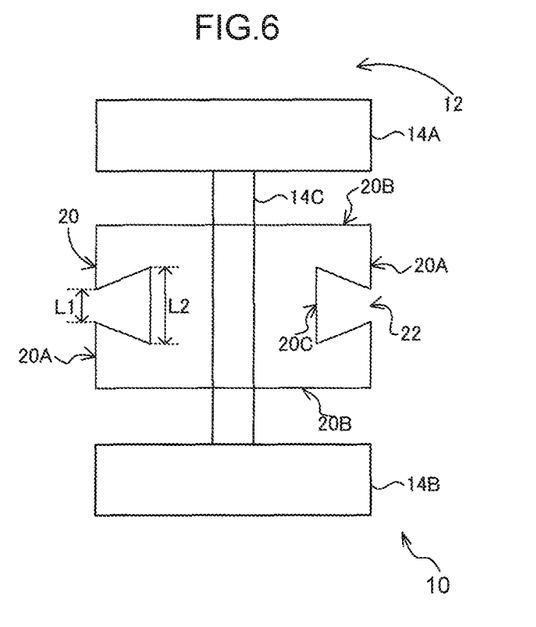
FIG. 6 is a plan view of an example of a semiconductor device of a second exemplary embodiment.

The projections 22 of the fuse window 20 of the semiconductor device 10 of present exemplary embodiment differ from those of the semiconductor device 10 of the first exemplary embodiment. Although the projections 22 of the fuse window 20 have rectangular shapes in the first exemplary embodiment, the projections 22 of the semiconductor device 10 have trapezoidal shapes that increase in width toward the inside of the fuse window 20 in the present exemplary embodiment, as illustrated in FIG. 6.

Specifically, the sidewall side width L1 of the projections 22 formed to the sidewalls 20A of the fuse window 20 is narrower than the projecting side width L2 of the projections 22. The projecting side width L2 is preferably at least four times greater than the sidewall side width L1. In the present exemplary embodiment, a length of the sidewall side width L1 is set to 0.5 µm as a specific example.

When the fuse element 14C is to be blown, similarly to the first exemplary embodiment, the fuse element 14C inside the fuse window 20 is blown, for example, by laser repair or the like, as illustrated in FIG. 3A.

Figure 7:
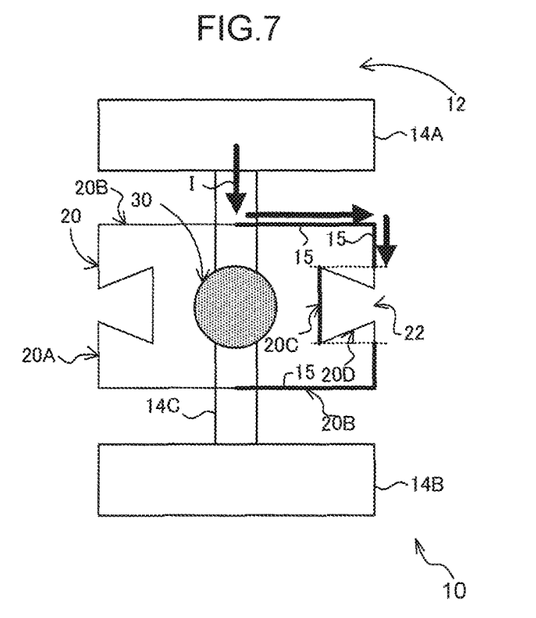
FIG. 7 is a plan view for explaining a current path interruption effect in the semiconductor device illustrated in FIG. 6.

In the semiconductor device 10 of the present exemplary embodiment, during laser repair at the fuse element 14C, sublimed metal may adhere as deposit to the inner walls of the fuse window 20. As illustrated in FIG. 7, in the semiconductor device 10 of the present exemplary embodiment, deposit 15 adheres to the inside of the sidewalls 20B of the fuse window 20. Deposit 15 also adheres to the fuse element 14C side of the inner sides 20C of the projections 22. Although deposit 15 also adheres to the sidewalls 20A, on this occasion deposit 15 does not adhere to portions shielded by the sides 20C, therefore deposit 15 does not adhere to the sidewalls 20A in the vicinity of the projections 22 as illustrated in FIG. 7. Deposit 15 also does not adhere to the sides 20D of the projections 22 that reach from the sidewalls 20A to the sides 20C due to the sides 20D being shielded by the sides 20C.

Thus, as illustrated in FIG. 7, the path through which current I flows is interrupted at the sides 20D and the sidewalls 20A in the vicinity of the projections 22. Accordingly, current I does not reach the metal layer 14B and there is no electrical continuity.

Consequently, according to the semiconductor device 10 of the present exemplary embodiment, the occurrence of shorting even though the fuse element 14C has been blown can be suppressed.

The manufacturing method of the semiconductor device 10 of the present exemplary embodiment is similar except for the shape of the mask when forming the fuse window 20. Explanation thereof is therefore omitted.

Third Exemplary Embodiment

The projections 22 of the fuse window 20 of the semiconductor device 10 of present exemplary embodiment differ from those of the semiconductor devices 10 of each of the exemplary embodiments described above.

In the present exemplary embodiment, the projections 22 each include a narrow width portion formed at the sidewall 20A side and a wide width portion formed to a leading end of the narrow width portion. In the present exemplary embodiment, the shape of each of the projections 22 is, as a specific example, configured in what is referred to as a letter T-shape, with the narrow width portion forming the center bar of the T and the wide width portion forming the top bar of the T, as illustrated in FIG. 8.

Figure 8:
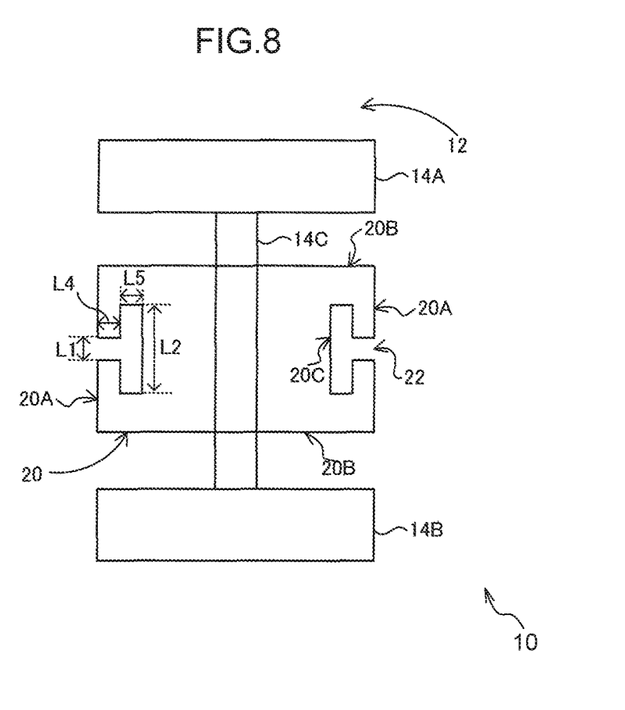
FIG. 8 is a plan view of an example of a semiconductor device of a third exemplary embodiment.

In the present exemplary embodiment, as illustrated in FIG. 8, similarly to the second exemplary embodiment, the projecting side width L2 of the projections 22 formed to the sidewalls 20A of the fuse window 20 is wider than the sidewall side width L1. From the perspective of making it hard for sublimate to adhere as described above, the sidewall side width L1 is preferably narrower than the projecting side width L2, and the projecting side width L2 is preferably at least four times greater than the sidewall side width L1.

Although the sidewall side width L1 is preferably long, the projections 22 are preferably small overall, and the size thereof may be determined in accordance with the precision of the exposure apparatus employed during formation of the projections 22.

In the semiconductor device 10 of the present exemplary embodiment, the projecting side width L2 of the projections 22 is preferably longer than a length L4 of the narrow width portions. The projecting side width L2 of the projections 22 is also preferably longer than a summed length of the narrow width portion length L4 and a length L5 of the wide width portions. The summed length of the narrow width portion length L4 and the wide width portion length L5 is preferably shorter than a distance from the sides 20C to the fuse element 14C.

In the present exemplary embodiment, as a specific example, the sidewall side width L1 is set to 0.5 µm, the projecting side width L2 is set to 2.0 µm, the narrow width portion length L4 is set to 0.5 µm, and the wide width portion length L5 is set to 0.5 µm.

Figure 9:
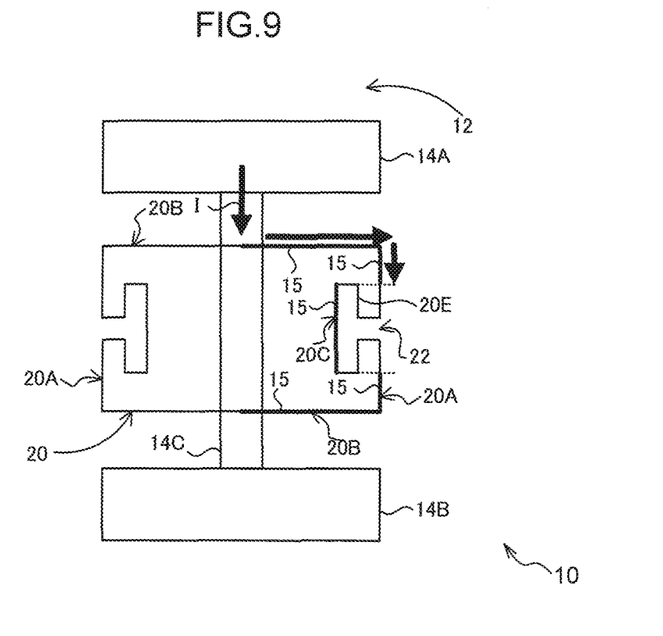
FIG. 9 is a plan view for explaining a current path interruption effect in the semiconductor device illustrated in FIG. 8.

In the semiconductor device 10 of the present exemplary embodiment, during laser repair at the fuse element 14C, sublimed metal may adhere as deposit to the inner walls of the fuse window 20. As illustrated in FIG. 9, in the semiconductor device 10 of the present exemplary embodiment, deposit 15 adheres to the inside of the sidewalls 20B of the fuse window 20. Deposit 15 also adheres to the fuse element 14C side of the inner sides 20C of the projections 22. Although deposit 15 also adheres to the sidewalls 20A, on this occasion deposit 15 does not adhere to portions shielded by the sides 20C, therefore deposit 15 does not adhere to the sidewalls 20A in the vicinity of the projections 22 as illustrated in FIG. 9. Deposit 15 also does not adhere to sides 20E of the wide width portions opposite to the sides 20C, or to the narrow width portions.

Thus, as illustrated in FIG. 9, the path through which current I flows is interrupted. Accordingly, current I does not reach the metal layer 14B and there is no electrical continuity.

Consequently, according to the semiconductor device 10 or the present exemplary embodiment, the occurrence of shorting even though the fuse element 14C has been blown can be suppressed.

In the semiconductor device 10 of the present exemplary embodiment, the area of the portions shielded by the sides 20C can be increased compared to that of the projections 22 of the fuse window 20 of the second exemplary embodiment due to the projections 22 of the fuse window 20 being configured in a T-shape. The region surrounding the projections 22 to which deposit 15 does not adhere can also be lengthened in the semiconductor device 10 of the present exemplary embodiment.

Consequently, according to the semiconductor device 10 of the present exemplary embodiment, the effectiveness of the interruption of the path through which current flows is increased due to it being even harder for sublimate from the metal layer 14 to adhere as deposit 15 to the sidewalls inside the fuse window 20.

As described above, in the semiconductor device 10 of the present exemplary embodiment, the size of the projections 22 can be decreased compared to each of the exemplary embodiments described above, since the projecting side width L2 of the projections 22 may be made wide, and the narrow width portion length L4 can be made short. Accordingly, it is possible to decrease the size of the fuse window 20. Decreasing the size of the fuse window 20 can suppress an increase in the area of the semiconductor device 10 in cases in which the semiconductor device 10 includes plural fuse elements 14C.

Note that the manufacturing method of the semiconductor device 10 of the present exemplary embodiment is similar except for the shape of the mask when forming the fuse window 20. Explanation thereof is therefore omitted.

Figure 10:
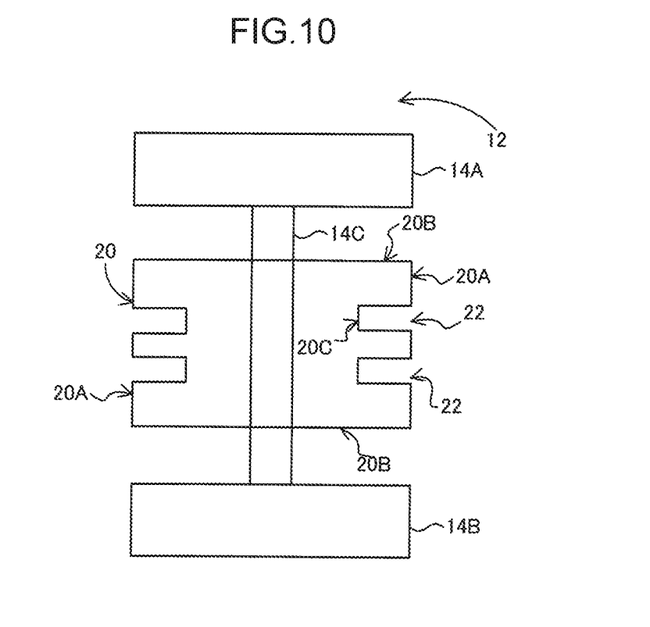
FIG. 10 is a plan view of an example of a case in which plural projections are formed to one of the sidewalls in the semiconductor device of the first exemplary embodiment.

In each of the exemplary embodiments described above, explanation has been given regarding a case in which one projection 22 is formed to each of the pair of sidewalls 20A; however, the number of projections 22 is not limited thereto. For example, as illustrated in FIG. 10, two projections 22 may be formed to each of the sidewalls 20A, and there is no limitation to the number thereof. The number of the projections 22 formed to each side of the pair of sidewalls 20A may also be different. Although forming plural projections 22 increases the effectiveness of interrupting current I, this increases the area of the fuse window. Thus, the number of the projections 22 formed may be determined in accordance with the area or the like allowed by the fuse window 20. Although FIG. 10 is illustrated with the projections 22 of the first exemplary embodiment, it goes without saying that the projections 22 of the second or third exemplary embodiments may be similarly applied.

Figure 11:
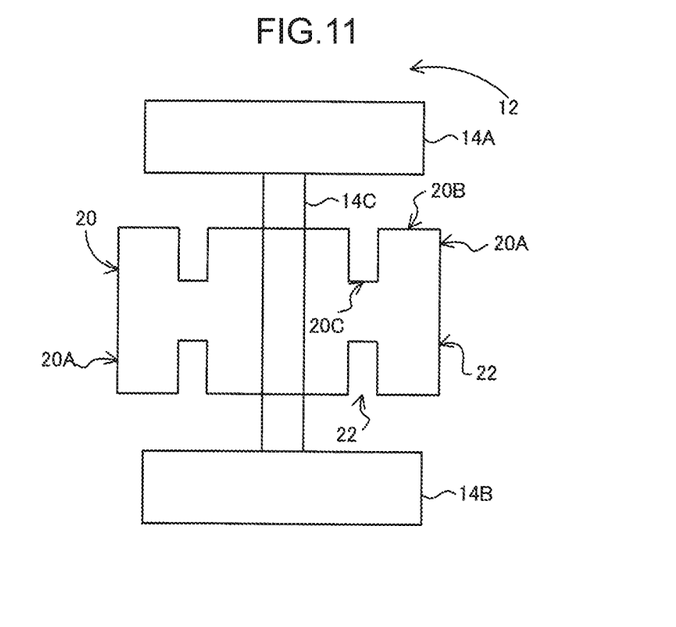
FIG. 11 is a plan view of an example of a case in which projections are formed to sidewalls in a different direction than in the semiconductor device of the first exemplary embodiment.

In each of the exemplary embodiments described above, explanation has been given regarding a case in which the projections 22 are formed to the sidewalls 20A; however, there is no limitation to the sidewalls of the fuse window 20 on which the projections 22 are formed. For example, as illustrated in FIG. 11, the projections 22 may be formed to the sidewalls 20B. In such cases, there is a tendency for the area of the fuse window 20 to increase compared to cases in which the projections 22 are provided to the sidewalls 20A, due to the length of the sidewalls 20B being determined in accordance with the position of the laser repair section 30, the length from the end portions of the sidewalls 20B to the projections 22, and the length of the sides 20C. Although FIG. 11 is illustrated with the projections 22 of the first exemplary embodiment, it goes without saying that the projections 22 of the second or third exemplary embodiments may be similarly applied.

Figure 12:
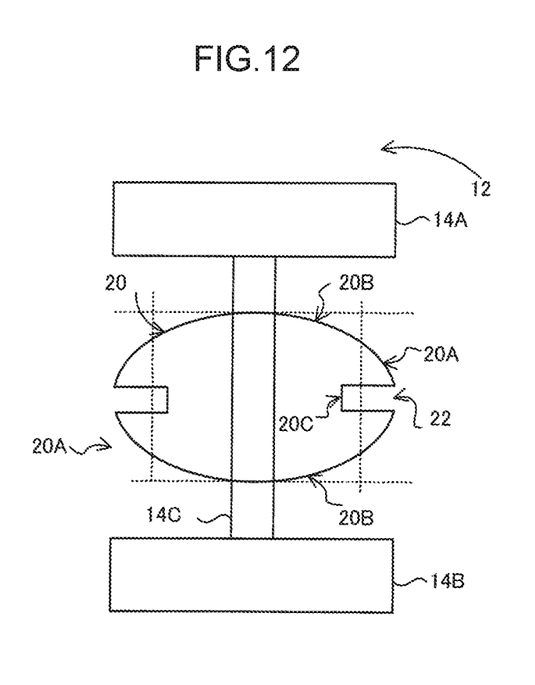
FIG. 12 is a plan view of an example of a case in which the fuse window in the semiconductor device of the first exemplary embodiment has a different shape.

In each of the exemplary embodiments described above, explanation has been given regarding a case in which the shape of the fuse window 20 is an oblong shape in which the sidewalls 20A are shorter than the sidewalls 20B; however, the overall shape of the fuse window 20 is not limited to an oblong shape. For example, the fuse window 20 may have a square shape in which the lengths of the sidewalls 20A and the sidewalls 20B are the same. The fuse window 20 is also not limited to having a rectangular shape, and may, for example have an elliptical shape like the fuse window 20 illustrated in FIG. 12, or may have a circular shape. Although FIG. 12 is illustrated with the projections 22 of the first exemplary embodiment, it goes without saying that the projections 22 of the second or third exemplary embodiments may be similarly applied.

In each of the exemplary embodiments described above, explanation has been given regarding a case in which the material of the fuse element 14C is metal; however, the material of the fuse element 14C is not limited thereto. For example, the material of the fuse element 14C may be a material other than metal. Examples of a material other than metal include polysilicon.

The configuration of the semiconductor device 10, the fuse window 20, and the like, and the manufacturing method and the like of the semiconductor device 10, explained in each of the exemplary embodiments described above, are merely examples, and may of course be modified as circumstances dictate within a range not departing from the spirit of the present disclosure.

What is claimed is:

1. A semiconductor device comprising:
   a fuse element; and
   a fuse window that is formed above a region including the fuse element, that includes a pair of first sidewalls extending in a first direction running along a direction that current flows in the fuse element and a pair of second sidewalls extending in a second direction intersecting the first direction, and that is formed with a projection projecting out from a sidewall side toward the inside at an inner wall of at least one out of the first sidewalls or the second sidewalls, the projection having a sidewall side width that is narrower than a projecting side width.

2. The semiconductor device of claim 1, wherein the projection includes a narrow width portion formed at the sidewall side and a wide width portion formed to a leading end of the narrow width portion.

3. The semiconductor device of claim 2, wherein the projection has a T-shape.

4. The semiconductor device of claim 1, wherein the projecting side width is at least two times greater than the sidewall side width.

5. The semiconductor device of claim 1, wherein a plurality of the projections are formed on both sidewalls of at least one out of the pair of first sidewalls or the pair of second sidewalls.

6. The semiconductor device of claim 1, further comprising:
   a first protective film that is formed over a region excluding the fuse window that is above a region including the fuse element; and
   a second protective film that is formed over the first protective film and over a region inside the fuse window.

7. A semiconductor device comprising:
   a fuse element; and
   a fuse window that is formed above a region including the fuse element, that includes a pair of first sidewalls extending in a first direction running along a direction that current flows in the fuse element and a pair of second sidewalls extending in a second direction intersecting the first direction, and that is formed with a projection projecting out from a sidewall side toward the inside at an inner wall of at least one out of the first sidewalls or the second sidewalls, the projection having a sidewall side width that is shorter than a sidewall length from a sidewall end portion to the projection and that is the same as an inner side width of the projection.

8. The semiconductor device of claim 7, wherein the sidewall length from the sidewall end portion to the projection is at least two times greater than the sidewall side width.

9. The semiconductor device of claim 7, wherein a plurality of the projections are formed on both sidewalls of at least one out of the pair of first sidewalls or the pair of second sidewalls.

10. The semiconductor device of claim 7, further comprising:
    a first protective film that is formed over a region excluding the fuse window that is above a region including the fuse element; and
    a second protective film that is formed over the first protective film and over a region inside the fuse window.

11. A method for manufacturing semiconductor device, the method comprising:
    forming a first protective film onto a region covering a region including a fuse element;
    removing the first protective film on a region including the fuse element, and forming a fuse window that is formed above the region including the fuse element, that includes a pair of first sidewalls extending in a first direction running along a direction that current flows in the fuse element and a pair of second sidewalls extending in a second direction intersecting the first direction, and that is formed with a projection projecting out from a sidewall side toward the inside at an inner wall of at least one out of the first sidewalls or the second sidewalls, the projection having a sidewall side width that is narrower than a projecting side width; and
    forming a second protective film onto a region covering the first protective film and the inside of the fuse window.

12. The method of claim 11, further comprising melting the fuse element inside the fuse window.

* * * * *